United States Patent
Watarai

(10) Patent No.: US 7,164,743 B2
(45) Date of Patent: Jan. 16, 2007

(54) DELAY LOCKED LOOP

(75) Inventor: Seiichi Watarai, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 629 days.

(21) Appl. No.: 10/241,515

(22) Filed: Sep. 12, 2002

(65) Prior Publication Data
US 2003/0053577 A1 Mar. 20, 2003

(30) Foreign Application Priority Data
Sep. 17, 2001 (JP) ............................. 2001-281115

(51) Int. Cl.
H03D 3/24 (2006.01)
(52) U.S. Cl. ...................... 375/375; 375/373; 375/371; 375/354
(58) Field of Classification Search ................ 375/375, 375/373, 371, 354
See application file for complete search history.

(56) References Cited

U.S. PATENT DOCUMENTS 3,558,933 A * 1/1971 Meyer ......................... 327/261
6,259,293 B1 7/2001 Hayase et al.
6,275,555 B1 * 8/2001 Song ........................... 375/375
6,424,580 B1 * 7/2002 Frey ............................ 365/194

FOREIGN PATENT DOCUMENTS

GB 2 341 286 3/2000

* cited by examiner

Primary Examiner—Chieh M. Fan
Assistant Examiner—Anna Ziskind
(74) Attorney, Agent, or Firm—Young & Thompson

(57) ABSTRACT

A delay locked loop of the present invention which synthesizes data and a clock inputted from outside has: voltage control delay loops having a plurality of delay circuit parts sequentially delaying the clock; a slot selector selecting a slot outputted from the delay circuit parts of the voltage control delay loops; a clock tree part creating a plurality of clocks with the same timing by an output of the slot selector; a phase control part phase-controlling the plurality of delay circuit parts corresponding to the output clock delay variation of the clock tree part; and sensing means on-off controlling all or part of the plurality of delay circuit parts and the slot selector.

16 Claims, 4 Drawing Sheets

DELAY LOCKED LOOP

BACKGROUND OF THE INVENTION

1. Field of the Invention

The present invention relates to a delay locked loop. More specifically, the present invention relates to a voltage control delay loop (VCDL) forming a delay locked loop (DLL).

2. Description of the Prior Art

In the field of high-speed data communication, synchronization of data and a clock to be inputted has been an important technique.

For example, in a synchronization system in the field of high-speed data communication having a data transfer speed exceeding 2 gigabits/sec (Gbps), as one of means for uniformalizing the edges of a clock input and a data input, a DLL is used to cancel a propagation delay time in a buffer of a clock tree circuit (CT) in a chip (IC).

FIG. 4 is a block diagram of a delay locked loop (DLL) showing an example of such a prior art. As shown in FIG. 4, the DLL has a clock receiver 1 receiving a clock of 1.25 GHz inputted from a clock (CL) terminal; a delay circuit part 15 having n delay elements 16 connected in series for input and sequential delay of a reception clock (A) outputted from the clock receiver 1; a clock tree (CT) part 6 creating clocks (B) with the same timing based on an output of the delay circuit part 15; a phase control part 7 performing phase-control by the reception clock (A) and the clock (B) from the CT 6 to on/off control the delay elements 16 of the delay circuit part 15; data receivers 8, 9 receiving data of 2.5 Gbps inputted from data input terminals (D0 to D15); and flip-flops (F/Fs) 10, 11 storing the data by reception outputs (C) of the data receivers 8, 9 and the clocks (B) from the DT part 6. The phase control part 7 is represented in one block, and has functions of phase detect, charge pump and low-pass filter. Only the two data receivers 8, 9 and only the two F/Fs 10, 11 are shown. The data receivers 8, 9 and the F/Fs 10, 11 are naturally provided corresponding to the number of the data input terminals.

Such DLL compensates for the clock delay variation of the CT part 6 by the phase control part 7 and the delay circuit part 15 and locks the clock (B).

FIG. 5 is a data and clock waveform chart of FIG. 4. As shown in FIG. 5, the rising edge of the clock (B) to be synchronized with the data (C) after one cycle of the reception clock (A) is a lock point (LP) via the delay circuit part 15 and the CT part 6 in the DLL. In other words, the clock (B) is locked at the rising edge of the clock (B). The clock (A) of 1.25 GHz is at a speed of 800 picoseconds (ps) in one clock cycle so as to mean that the total delay time of the delay circuit part 15 and the CT part 6 is 800 ps.

The data (C) is typically propagated in a timing delay 90 degrees in phase to the clock (A). When the data receivers 8, 9 are of the same construction (shape) and has the same performance, the timing shown in the drawing is maintained. For this reason, the flip-flops (F/Fs) 10, 11 can reliably receive the data (C) by the clocks (B) (that is, clocks 0 to 15) with the same timing.

FIG. 6 is a block diagram of the delay circuit part and the clock tree circuit shown in FIG. 4. As shown in FIG. 6, the basic circuit of the delay circuit part and the CT part 6 has differential NMOS transistors 20, 21 having gates to which clock input IN and IN inversion are supplied; load elements 17, 18 connected between the NMOSs 20, 21 and a power source VDD; and a constant current source 19 connected between the NMOSs 20, 21 and a ground GND. Clock output OUT and OUT inversion are taken out from the junctions of the NMOS transistors 21, 20 and the load elements 18, 17.

When the basic circuit is used in the delay elements 16 of the delay circuit part 15, the phase control part 7 variably controls the constant current source 19. The delay time of the delay circuit part 15 can be thus varied. As the load elements 17, 18 in the case of the delay circuit part 15, an active load of the NMOS transistor and a resistance load of high-resistance polysilicon are used. As the load elements 17, 18 in the case of the clock tree (CT) part 6, a resistance lead of high-resistance polysilicon is used.

The delay time of the above-mentioned prior art delay locked loop, particularly, the delay time of the clock tree (CT) part, largely depends on variation in the resistance elements forming the resistance loads.

When attempting to compensate for delay for the variation in the resistance elements only by a delay variation width generated by a current change of the current source of the delay circuit part, the resistance elements are return-controlled at the same time. A sufficient variation width cannot be compensated. As a result, a clock outputted from the CT part to the data processing part side cannot be locked. In other words, the lock point of the data and the clock cannot be determined.

BRIEF SUMMARY OF THE INVENTION

Objects of the Invention

An object of the present invention is to provide a delay locked loop which can compensate for delay time of a clock tree (CT) part only by a delay variation width of delay elements of a delay circuit part.

SUMMARY OF THE INVENTION

A delay locked loop of the present invention which synthesizes data and a clock inputted from outside has:
- voltage control delay loops having a plurality of delay circuit parts sequentially delaying the clock;
- a slot selector selecting a slot outputted from the delay circuit parts of the voltage control delay loops;
- a clock tree part creating a plurality of clocks with the same timing by an output of the slot selector;
- a phase control part phase-controlling the plurality of delay circuit parts corresponding to the output clock delay variation of the clock tree part; and
- sensing means on-off controlling all or part of the plurality of delay circuit parts and the slot selector.

BRIEF DESCRIPTION OF THE DRAWINGS

The above-mentioned and other objects, features and advantages of this invention will become more apparent by reference to the following detailed description of the invention taken in conjunction with the accompanying drawings, wherein.

DETAILED DESCRIPTION OF THE INVENTION

Figure 1:
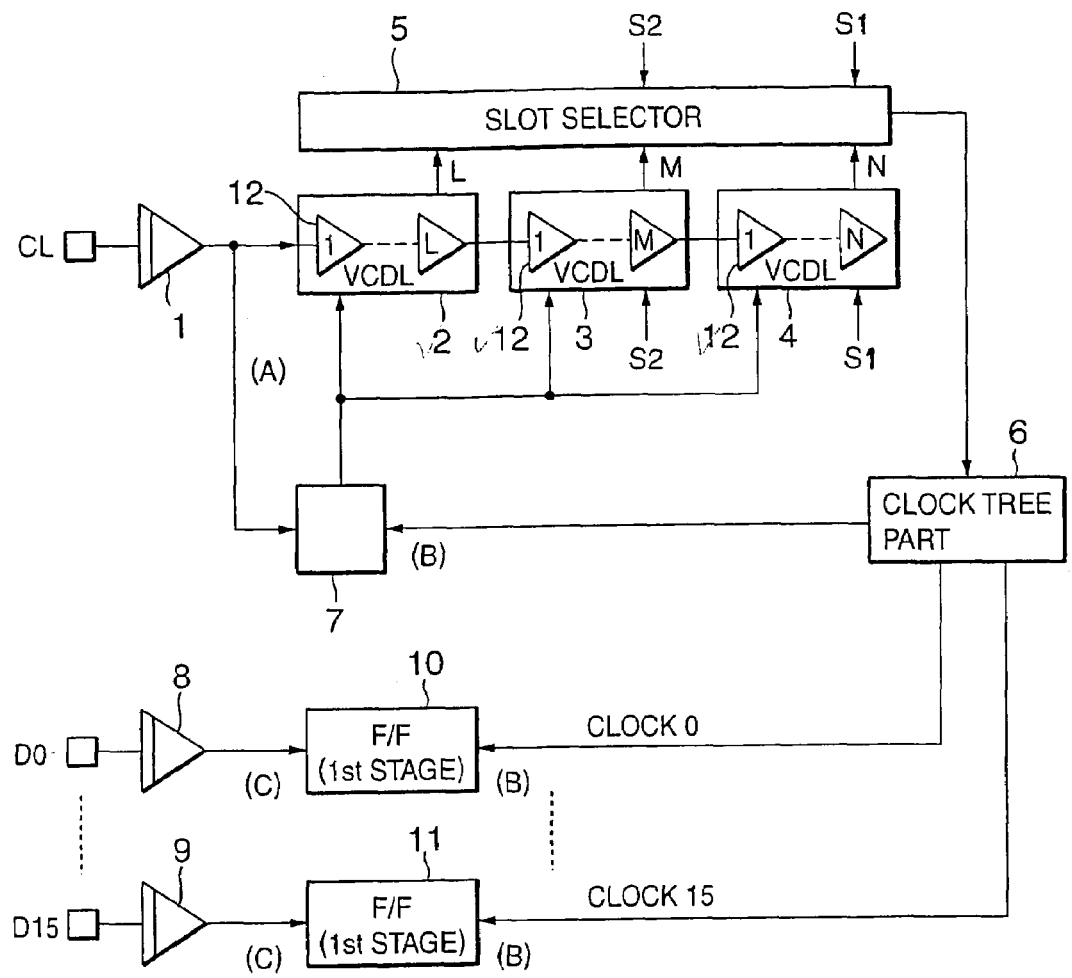
FIG. 1 is a block diagram of a delay locked loop of assistance in explaining an embodiment of the present invention.
Figure 4:
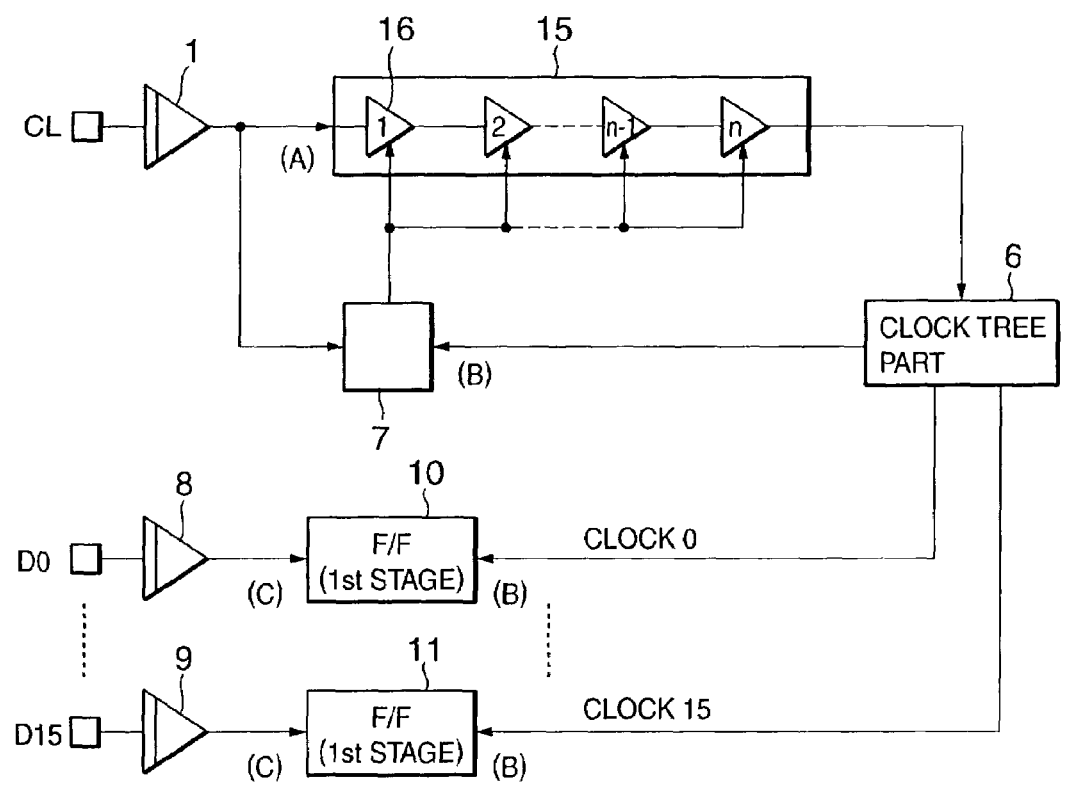
FIG. 4 is a block diagram of a delay locked loop showing an example of a prior art.

An embodiment of the present invention will be described below with reference to the drawings. FIG. 1 is a block diagram of a delay locked loop of assistance in explaining an embodiment of the present invention. As shown in FIG. 1, a DLL of this embodiment has a clock receiver 1 receiving a clock of 1.25 GHz inputted from a clock (CL) terminal; a voltage control delay loop (VCDL) 2 having L delay elements 12 connected in series for input and sequential delay of a reception clock (A) outputted from the clock receiver 1 and outputting slot L by a phase control signal; a VCDL 3 having N delay elements 12 connected in series for input and sequential delay of the output of the VCDL 2, that is, the slot L and outputting slot M by the phase control signal and the later-described select signal S2; a VCDL 4 having N delay elements 12 connected in series for input and sequential delay of the output of the VCDL 3, that is, the slot M and outputting slot N by the phase control signal and the later-described select signal S1; a slot selector 5 selecting the slots L, M and N outputted from the VCDLs 2 to 4 by the select signals S1, S2 and outputting the selected slot as a clock; a clock tree (CT) part 6 creating clocks (B) with the same timing by the clock of the slot selector 5; a phase control part 7 performing phase control by the reception clock (A) and the clock (B) from the CT 6 to on/off control the delay elements 12 of the VCDLs 2 to 4 for each group (L, M and N); data receivers 8, 9 as the data part circuit explained in FIG. 4; and flip-flops (F/Fs) 10, 11. Also in this embodiment, the phase control part 7 is represented in one block as in the prior art of FIG. 4, and has functions of phase detect, charge pump and low-pass filter. Only the two data receivers 8, 9 and only the two F/Fs 10, 11 are shown. The data receivers 8, 9 and the F/Fs 10, 11 are naturally provided corresponding to the number of the data input terminals.

The DLL of this embodiment compensates for the clock delay variation of the CT part 6 by the phase control part 7, VCDLs 2 to 4, the slot selector 5, and the generation means of the select signals S1, S2 as the sensing means to lock the clock (B).

In this embodiment, the DLL senses the resistance value variation of differential circuits of the VCDLs 2 to 4 and the CT part 6 consisting mainly of the resistance load circuits to determine the basic number of the VCDLs 2 to 4 in response to the resistance value variation upon power-on. The basic number of the VCDLs 2 to 4 to be operated is held fixed until the power is shut off. After the basic number of the VCDLs 2 to 4 to be operated is held, the DLL changes to the locking operation of the clock (B), and performs the locking operation by the desired delay time.

Figure 2:
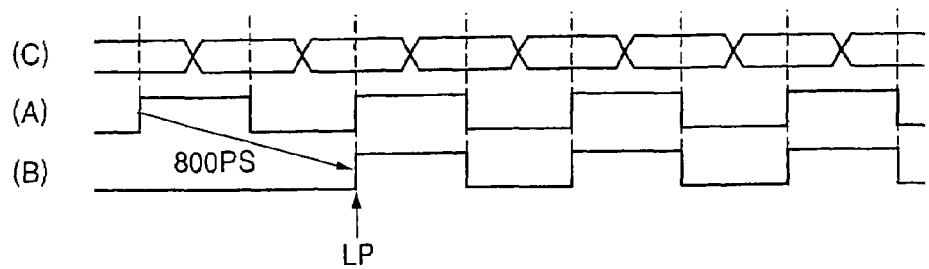
FIG. 2 is a data and clock waveform chart of FIG. 1.
Figure 5:
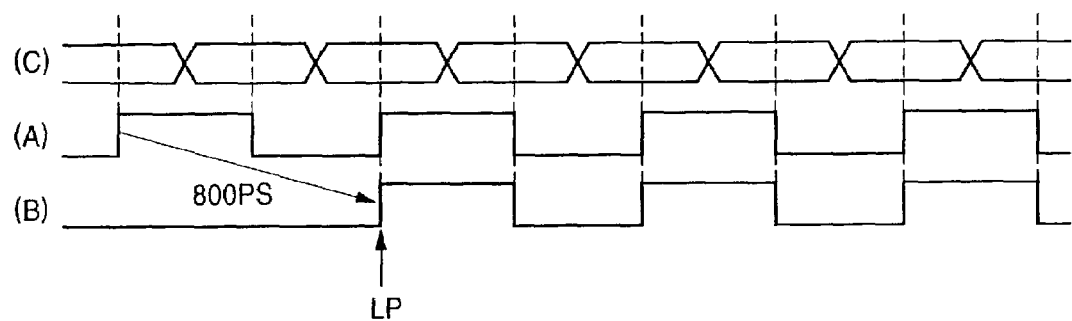
FIG. 5 is a data and clock waveform chart of FIG. 4.
Figure 6:
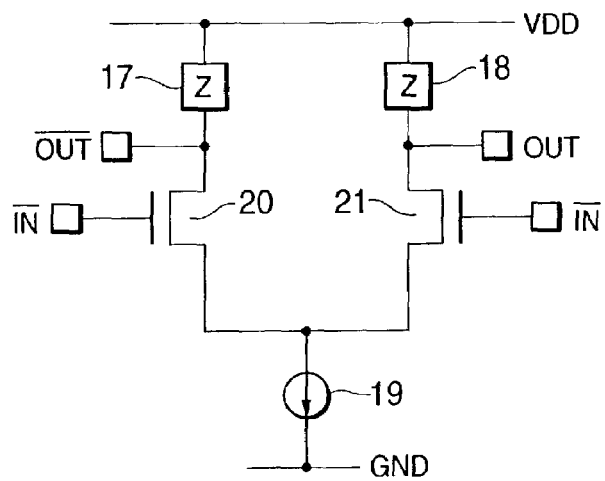
FIG. 6 is a block diagram of the clock tree circuit shown in FIG. 4.

FIG. 2 is a data and clock waveform chart of FIG. 1. As shown in FIG. 2, as in FIG. 5, the clock (B) delayed in one cycle (800 picoseconds) from the rising of the clock (A) received by the clock receiver 1 is created. The point is a lock point (LP).

Figure 3A:
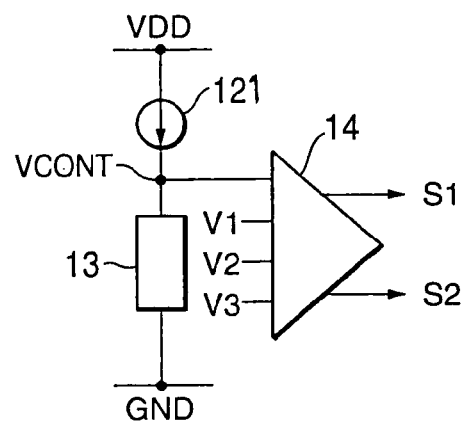
FIGS. 3A and 3B are diagrams showing a select signal generation circuit of FIG. 1 and its voltage and resistance features.
Figure 3B:
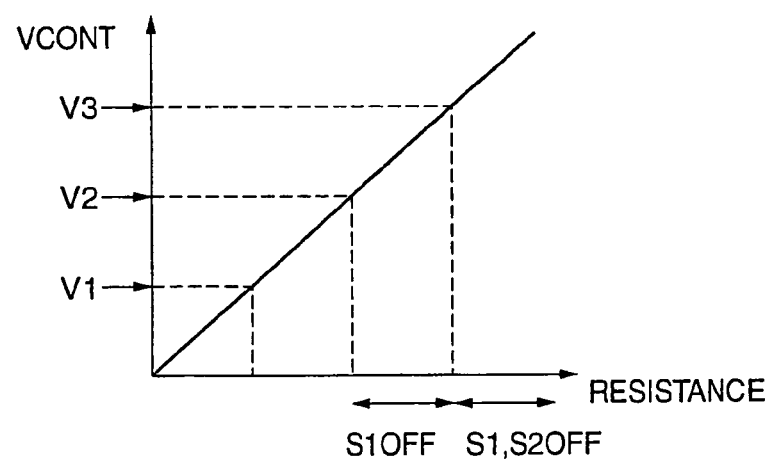

FIGS. 3A and 3B are diagrams of a select signal generation circuit of FIG. 1 and its voltage and resistance features. As shown in FIG. 3A, the select signal generation circuit is used as the sensing means sensing the variation in load resistance (load resistance of the delay elements 12 in the VCDLs 2 to 4, load resistance in the CT part 6, or the resistance element described below) The construction is formed by a resistance element 13 having the same shape as the load resistance; a constant current source 121 supplying a constant current (a constant current not depending on the resistance element 13) to the resistance element 13; and a Schmidt comparator 14 comparing potential VCONT of the junction of the resistance element 13 and the constant current source 121 with threshold voltages V1, V2 and V3 (V3 >V2 >V1) as reference voltages having different values to output the select signals S1, S2.

In such sensing means, when the constant current is supplied to the resistance element 13 having the same shape as the load resistance, the VCONT potential as one end of the input of the Schmidt comparator 14 is varied to the electric potential corresponding to the resistance value of the resistance element 13.

When the resistance value is made to be small, as shown in FIG. 3B, the VCONT is positioned between the reference threshold voltages V1 and V2 and the delay time of the clock tree part 6 and the VCDLs 2 to 4 indicates a small value. At this time, the select signals S1, S2 are both on and the VCDLs 2 to 4 are all operated to change the clock into the lock state.

When the resistance value is made in a center region, as shown in FIG. 3B, the VCONT is positioned between the reference threshold voltages V2 and V3 and the delay time of the clock tree part 6 and the VCDLs 2 to 4 indicates an almost center value. At this time, only the select signal S1 is off and the VCDLs 2 and 3 are operated to change the clock into the lock state.

When the resistance value is made to be large, as shown in FIG. 3B, the VCONT is positioned above the reference threshold potential V3 and the delay time of the clock tree part 6 and the VCDLs 2 to 4 indicates a large value. At this time, the select signals S1, S2 are both off and only the VCDL 2 is operated to change the clock into the lock state.

The Schmidt comparator 14 is used in a high-speed differential common mode logic (CML) circuit. The high-resistance polysilicon often used in the high-speed differential CML circuit has a very low temperature dependence. The resistance value of the resistance element once manufactured indicates an almost constant value during operation. In this embodiment, when such a resistance element is used, a Schmidt circuit is provided so as to prevent the value of the potential VCONT from exceeding the threshold voltages V2, V3 due to the influence of noise. In other words, when the power is once turned on and the potential VCONT exceeds the threshold voltage V3, the select signals S1, S2 are prevented from being turned on unless the potential VCONT is below the threshold voltage V1. As a result, when using the Schmidt comparator 14, noise margin can be increased.

As described above, the delay locked loop of the present invention determines, upon power-on, the basic number of the plurality of VCDLs provided depending on the resistance value variation of the resistance loads. When the delay variation width of the VCDL is small, the clock of the clock tree (CT) part can be locked within the variation range. To put it briefly, the resistance value variation of the resistance loads of the VCDLs is sensed, and then, the basic number of the VCDLs is determined corresponding to the variation to lock the clock. Even when the delay variation width of the VCDLs is small, malfunction can be prevented.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A delay locked loop which synchronizes data and a clock input from outside, said delay locked loop comprising:
   a voltage controlled delay line having a plurality of delay elements sequentially delaying said clock, said plurality of delay elements arranged in groups;
   a slot selector selecting an output signal output from one of said groups in response to a select signal;
   a clock tree circuit receiving said output signal from said slot selector for outputting a plurality of clocks with the same timing;
   a phase control part receiving said clock input from outside and one of said clocks output from said clock tree circuit for controlling a delay time of said plurality of delay elements such that said clock output from said clock tree circuit delays a predetermined constant time from said clock input from outside; and
   a sensing circuit sensing a variation of resistance value of a load resistance of a differential circuit which has a delay time contributing a portion of said constant time and outputting said select signal in response to said sensed variation of resistance value,
   wherein said sensing circuit comprises a resistance element having one end connected to a first power source and formed to be the same resistance value as the load resistance of said differential circuit, a constant current source connected between a second power source and the other end of said resistance element, and a Schmidt comparator circuit receiving a junction potential of said resistance element and said constant current source as one input and threshold voltages having a plurality of reference potentials as other inputs and outputting said select signal as a comparison result.

2. The delay locked loop according to claim 1, wherein said voltage controlled delay line is formed by connecting said plurality of delay elements in series.

3. The delay locked loop according to claim 1, wherein said differential circuit is said delay element.

4. The delay locked loop according to claim 1, wherein said differential circuit is a buffer in said clock tree circuit.

5. The delay locked loop according to claim 1, said slot selector selects an output signal output from one of said groups in response to said select signal upon power-on and fixedly holds until power is shut off.

6. A delay locked loop which synchronizes data and an outside clock input, comprising:
   a first voltage control delay loop (2) connected to receive a reception clock (A), the first voltage control delay loop comprising plural delay elements (12) connected in series for input and sequential delay of the received reception clock (A) and outputting a first slot (L) by a phase control signal;
   a second voltage control delay loop (3) connected to receive the first slot (L) output from the first voltage control delay loop, the second voltage control delay loop comprising plural delay elements (12) connected in series for input and sequential delay of the received first slot (L) and outputting a second slot (M) by the phase control signal and under a first select signal (S2);
   a third voltage control delay loop (4) connect to receive the second slot (M), the second voltage control delay loop comprising plural delay elements (12) connected in series for input and sequential delay of the received second slot and outputting a third slot (N) by the phase control signal and under a second select signal (Sl);
   a slot selector (5) connected to each of the first, second, and third voltage control delay loops and selecting one slot of the first, second, and third slots through the first and second select signals (Sl, S2), the selected one slot being output as a clock signal;
   a clock tree (6) connected to receive the clock signal from the slot selector and creating plural output clocks (B) with the same timing as the received clock signal;
   a phase control part (7) connected to receive the reception clock (A) and to receive one of the created clocks (B) from the clock tree, the phase control part performing phase-control by providing the phase control signal, based on the received reception clock (A) and the one received created clock (B), to on/off control the delay elements (12) of the first, second, and third voLtage control delay loops; and
   a sensing circuit generating the first and second select signals based on sensing a variation of resistance value of a load resistance of the delay elements (12).

7. The delay locked loop of claim 6, further comprising:
   data receivers (8, 9); and
   flip-flops (10, 11) connected to the data receivers and connected to the clock tree to receive clock signals.

8. The delay locked loop of claim 7, wherein, the phase control part (7) comprises a phase detector, a charge pump, and a low-pass filter.

9. The delay locked loop of claim 7, wherein, a clock delay variation of the clock tree (6) is compensated by sensing load resistance value variation of the delay elements (12).

10. The delay locked loop of claim 9, wherein, the sensing circuit comprises a select signal generation circuit sensing the variation in the load resistance of the delay elements and a variation in load resistance in the clock tree (6), and providing the first and second select signals,
    the select signal generation circuit comprising
    a resistance element (13) corresponding in resistance value to a load resistance being sensed,
    a constant current source (121) supplying a constant current to the resistance element (13), and
    a Schmidt comparator (14) i) comparing a potential (VCONT) of a junction of the resistance element (13) and the constant current source (121) with threshold voltages (V1, V2, V3) input to the Schmidt comparator as reference voltages, and ii) outputting the first and second select signals (S1, S2), the first and second select signals having different values.

11. A delay locked loop which synchronizes data and an outside clock input, comprising:
    first, second, and third voltage control delay loops (2, 3, 4) connected in series,
    the voltage control delay loops each comprising plural delay elements (12) connected in series for input and sequential delay of received clock signals,
    the first voltage control delay loop connected to received a reception clock (A) and output a first slot (L) under direction of a phase control signal,
    the second voltage control delay loop (3) connected to receive the first slot (L) output from the first voltage control delay loop, to sequentially delay the received first slot (L) and to output a second slot (M) under direction of i) the phase control signal and ii) a first select signal (S2);
    a third voltage control delay loop (4) connected to receive the second slot (M), to sequentially delay the received second slot, and to output a third slot (N) under direction of i) the phase control signal and ii) a second select signal (S1)

a slot selector (5) connected to each of the first, second, and third voltage control delay loops and selecting one slot of the first, second, and third slots through the first and second select signals (S1, S2), the selected one slot being output as a clock signal;

a clock tree (6) connected to receive the clock signal from the slot selector and creating plural output clocks (B) with the same timing as the received clock signal from the slot selector;

a phase control part (7) connected to receive the reception clock (A) and to receive one of the created clocks (B) from the clock tree, the phase control part performing phase-control by providing the phase control signal, based on the received reception clock (A) and the one received created clock (B), to on/off control the delay elements (12) of the first, second, and third voltage control delay loops; and a sensing circuit sensing a variation of resistance value of a load resistance of the delay elements (12) and, based on the sensed variation, providing the first and second select signals.

12. The delay locked loop of claim 11, wherein, the phase control part (7) comprises a phase detector, a charge pump, and a low-pass filter.

13. The delay locked loop of claim 11, wherein, the sensing circuit further senses a clock delay variation of the clock tree (6).

14. The delay locked loop of claim 11, wherein, the sensing circuit comprises:

a resistance element (13) corresponding to a load resistance being sensed, a constant current source (121) supplying a constant current to the resistance element (13), and a comparator (14) i) comparing a potential (VCONT) of a junction of the resistance element (13) and the constant current source (121) with threshold voltages (V1, V2, V3) input to the comparator as reference voltages, and ii) outputting the first and second select signals (51, S2), the first and second select signals having different values.

15. The delay locked loop of claim 14, wherein, the comparator is a Schmidt comparator.

16. The delay locked loop of claim 11, wherein, the sensing circuit comprises a comparator (14) i) comparing a potential representing a load resistance being sensed with reference voltages, and, based on the comparison, ii) outputting the first and second select signals (S1, S2), the first and second select signals having different values.

* * * * *